US 6,623,345 B2

(12) United States Patent
Angell et al.

(10) Patent No.: US 6,623,345 B2
(45) Date of Patent: Sep. 23, 2003

(54) WAFER FOR CLEANING SEMICONDUCTOR DEVICE PROBE

(75) Inventors: Larry D. Angell, Boise, ID (US);
Andrew J. Krivy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/901,941

(22) Filed: Jul. 9, 2001

(65) Prior Publication Data

US 2002/0019196 A1 Feb. 14, 2002

Related U.S. Application Data

(60) Continuation of application No. 09/495,142, filed on Jan. 31, 2000, now Pat. No. 6,257,958, which is a division of application No. 09/027,018, filed on Feb. 20, 1998, now Pat. No. 6,019,663, which is a division of application No. 09/495,191, filed on Jan. 31, 2000, now Pat. No. 6,254,469.

(51) Int. Cl.[7] .............................................. B24D 11/00
(52) U.S. Cl. ..................... 451/527; 451/539; 451/552
(58) Field of Search ........................ 134/6, 18, 113; 451/5, 8, 9, 10, 41, 42, 49, 58, 526, 527, 548, 552, 539, 550, 530

(56) References Cited

U.S. PATENT DOCUMENTS

| 1,208,688 A | 12/1916 | Stempel, Jr. ............ 451/526 X |
| 3,186,135 A | 6/1965 | Crean ........................ 451/526 |
| 4,010,583 A | 3/1977 | Highberg |
| 4,288,233 A | 9/1981 | Wiand ......................... 51/295 |
| 4,314,855 A | 2/1982 | Chang et al. .................. 134/3 |
| 4,893,438 A * | 1/1990 | Fry et al. .................... 451/526 |
| 5,605,501 A | 2/1997 | Wiand ......................... 451/526 |
| 5,875,559 A * | 3/1999 | Birang et al. .................. 33/553 |
| 5,958,148 A | 9/1999 | Holzapfel et al. ............. 134/18 |
| 6,089,963 A | 7/2000 | Wiand et al. ................ 451/390 |
| 6,095,912 A | 8/2000 | Ferronato .................... 451/526 |

OTHER PUBLICATIONS

SupraSurf AADS—995 Thin Film Substrates, Coors Ceramics Company, Electronics Division, Golden, Colorado (1987).

* cited by examiner

*Primary Examiner*—Timothy V. Eley
(74) *Attorney, Agent, or Firm*—Workman Nydegger

(57) ABSTRACT

A system and method for cleaning probe pins on a probe card used in testing a semiconductor device during fabrication thereof. A ceramic cleaning wafer is utilized to clean the probe pins without having to remove the probe card from a production line. The same apparatus used to test production wafers also handles the cleaning wafer during a probe cleaning cycle. During operation of the cleaning cycle, the cleaning wafer is placed in a manual load tray, which inserts the cleaning wafer into a prober machine. The cleaning wafer is transported by a robotic trolley to a prealign stage area where the cleaning wafer is aligned and centered. The cleaning wafer is then placed on a support device. The support device and cleaning wafer are positioned under a pneumatic sensor and profiled to determine wafer planarity. The support device and cleaning wafer are then positioned underneath the probe pins on the probe card to be cleaned. Thereafter, the z-axis distance between the probe pins and the surface of the cleaning wafer is decreased such that the probe pins contact the cleaning wafer, thereby removing debris from the probe pins. The cleaning wafer is then removed from the support device when cleaning of the probe pins has been completed.

20 Claims, 3 Drawing Sheets

WAFER FOR CLEANING SEMICONDUCTOR DEVICE PROBE

CROSS-REFERENCE TO RELATED APPLICATIONS

This application is a continuation of U.S. patent application Ser. No. 09/495,142, filed on Jan. 31, 2000, now U.S. Pat. No. 6,257,958, which is a divisional application of U.S. patent application Ser. No. 09/027,018, filed on Feb. 20, 1998, now U.S. Pat. No. 6,019,663, of which U.S. patent application Ser. No. 09/495,191, filed on Jan. 31, 2000, now U.S. Pat. No. 6,254,469, is another divisional, all of which are incorporated herein by reference.

BACKGROUND OF THE INVENTION

1. The Field of the Invention

The present invention relates generally to semiconductor device testing during fabrication. More particularly, the present invention relates to a system and method that employs a cleaning wafer for in-line cleaning of probe pins on a probe card used in testing semiconductor devices during fabrication.

2. The Relevant Technology

During fabrication of semiconductor devices from silicon wafers, a prober machine is used to interface a semiconductor device to a tester machine while still in wafer form prior to cutting the wafer into individual chips. A typical prober machine includes a probe card having an array of probe pins that contact bond pads on the semiconductor device during testing. The bond pads on the semiconductor device are made from metallic materials such as aluminum which can oxidize when exposed to air. Also, organic material left over from certain fabrication processes can be disposed on the bond pads. When probe pin tips repeatedly contact bond pads on a silicon wafer, metal oxides such as aluminum oxides and other materials on the bond pads can build-up on the probe pin tips, thereby interfering with the function of the probe pins during testing operations. Thus, it becomes necessary to periodically clean the probe pins on a probe card.

In conventional cleaning operations, a probe maintenance station is utilized in order to clean probe pins on a probe card used in testing fabricated semiconductor devices. This requires the removal of the probe card from the production line in order to clean the probe pins, resulting in a certain amount of production downtime. The production downtime includes the time to remove the probe card from the prober, and the time to install and perform a complete new set up for a clean probe card. Also, additional time is spent in taking the dirty probe card to a hardware support facility, in cleaning/aligning, and documenting the probe card, and in getting the cleaned probe card back to production personnel.

As manufacturing techniques have improved, it has become possible to probe more semiconductor dies in parallel at one time, requiring increasingly wider probe card arrays. This has resulted in ever increasing difficulty and downtime in order to have the probe card arrays taken off-line, to replace the probe card arrays, and then to bring the system back on-line, as well as additional time to clean the removed probe card arrays and bring the arrays back into service. While various ceramic burnishing chucks have been used in the past to clean probe tips, such as separate chucks with a piece of ceramic thereon for the probes to touch down on for cleaning, such conventional burnishing chucks are too small for the wider probe cards currently used.

Accordingly, there is a need for improved probe pin cleaning systems and methods that overcome or avoid the above problems.

BRIEF SUMMARY OF THE INVENTION

The present invention is directed to a system and method that employs a cleaning wafer such as a ceramic wafer disc for in-line cleaning of probe pins on a probe device such as a probe card in a prober machine used in testing semiconductor devices during fabrication. The shape and thickness of the cleaning wafer is similar to a silicon production wafer, allowing the cleaning wafer to be inserted in place of the silicon production wafer in order to perform a cleaning cycle for the probe pins without having to remove the probe card from a production line. The cleaning wafer is used to make contact with the probe pin tips and remove any buildup of oxides or other undesired substances that tend to accumulate on the probe pin tips. The same apparatus used to test production wafers also handles the cleaning wafer during a probe cleaning cycle.

During operation of the cleaning cycle, the cleaning wafer is placed in a manual load tray or auxiliary tray, which inserts the cleaning wafer into a prober machine. The cleaning wafer is transported by a robotic trolley to a prealign stage area where the cleaning wafer is aligned and centered. The cleaning wafer is then placed on a support device. The support device and cleaning wafer are positioned under a pneumatic sensor and profiled to determine wafer planarity. The support device and cleaning wafer are then positioned underneath the probe pins on the probe card to be cleaned. Thereafter, the z-axis distance between the probe pins and the surface of the cleaning wafer is decreased such that the probe pins contact the cleaning wafer. The probe pins can be repeatedly contacted with the cleaning wafer to remove unwanted debris from the probe pins. The cleaning wafer is removed from the support device and prober machine when cleaning of the probe pins has been completed.

The cleaning wafer preferably has a substantially circular shape and blocks transmission of nonionizing electromagnetic radiation energy therethrough such as infrared light energy. In one embodiment, the cleaning wafer has a first abrasive surface made of a ceramic material capable of removing unwanted debris from a probe tip, and a second opposing surface having an opaque coating thereon capable of blocking transmission of infrared light energy through the wafer. An outer periphery between the first and second surfaces has a notch formed therein to allow proper alignment of the cleaning wafer when loaded into the prober machine.

The present invention allows probe pins on a probe card to be effectively cleaned while still installed in a prober machine, thereby eliminating the need to remove the probe card, reinstall a clean probe card, and rerun a complete new set-up for the clean probe card. This results in a reduction in production downtime.

Other aspects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

Figure 1:
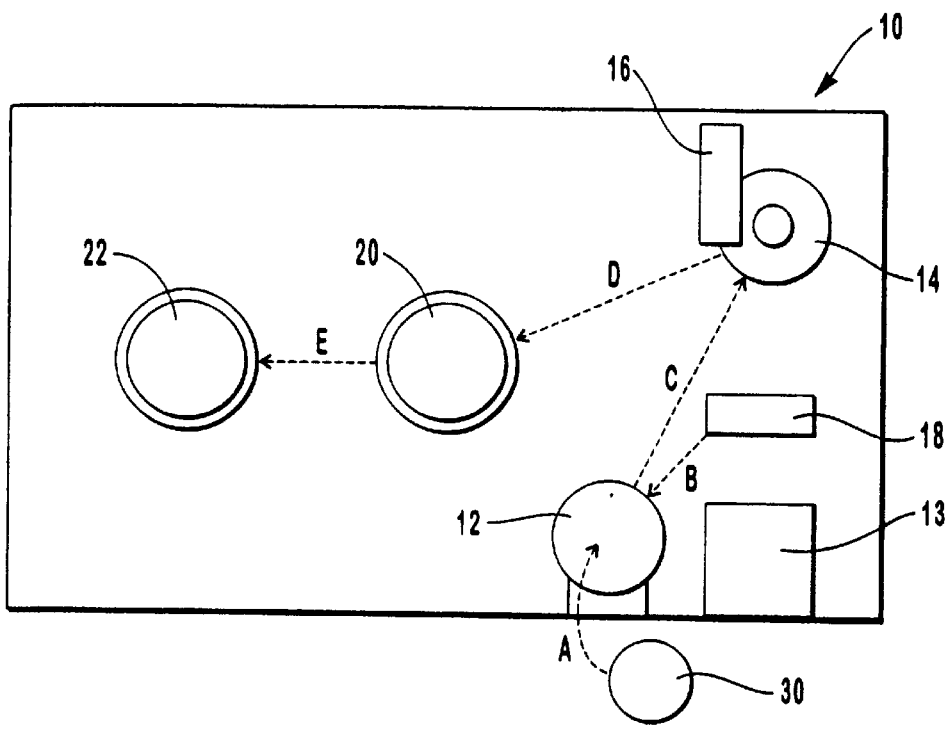
FIG. 1 is a schematic plan view of a prober system that can utilize the cleaning wafer according to the invention to clean probe pins on a probe card used in testing semiconductor devices during fabrication.

The present invention is directed to a system and method that employs a cleaning wafer such as a ceramic wafer disc for in-line cleaning of probe pins on a probe device such as a probe card in a production prober machine used in testing semiconductor devices during fabrication. Thus, the cleaning wafer of the invention is used to clean probe pins on a probe card while still in a production setting. The shape and thickness of the cleaning wafer is similar to a silicon production wafer. This allows the cleaning wafer to be inserted in place of a silicon production wafer in a prober machine in order to perform a cleaning cycle. The cleaning wafer is used to make contact with probe pin tips and remove any buildup of oxides or other undesired substances that tend to accumulate on the probe pin tips. By making several touchdowns on the ceramic wafer disc, the oxides or other debris can be cleaned from the probe pin tips.

The cleaning wafer of the invention can be made of any abrasive material that has a suitable grain size for cleaning the probe pins. The rough surface on the wafer acts as an abrasive to clean off the probe pin tips. The cleaning wafer can be made from a variety of commercially available materials. Preferably, a ceramic material is used to make the cleaning wafer, including materials such as alumina, silicon nitride, silicon carbide, tungsten carbide, and mixtures thereof. One suitable ceramic material is SupraSurf ADS-995 available from Coors Ceramics Company, of Oakridge, Tenn. This ceramic material has a 5 microinch surface finish, with an average grain size of up to 2.2 microns, and is made primarily of alumina.

The cleaning wafer preferably has a circular shape in the form of a flat disc. The cleaning wafer can be formed such that both surfaces of the wafer are abrasive. In one embodiment, the cleaning wafer of the invention is sized to have a diameter of about 8 inches (about 200 mm) and a thickness of from about 10 mil to about 50 mil, and preferably from about 20 mil to about 40 mil. The cleaning wafer preferably has a planar surface that deviates less than about 6 microinches.

In order for the cleaning wafer of the invention to be properly loaded in a prober machine during production, it is necessary to prevent radiant electromagnetic energy from traveling through the cleaning wafer. Thus, a ceramic cleaning wafer according to the invention is preferably rendered opaque in order to block transmission of nonionizing radiant electromagnetic energy therethrough, particularly in the infrared (IR) wavelengths. Otherwise, if the cleaning wafer is translucent, IR wafer sensors in the prober machine read through the translucent characteristics of the cleaning wafer and the cleaning wafer is not loaded. The cleaning wafer can be rendered opaque such as by being painted a dark color, or can be made opaque originally. For example, a high temperature brown or black paint can be sprayed on the backside of a ceramic wafer disc. This prevents IR wafer sensors from reading through the ceramic wafer disc, and enables the ceramic wafer disc to be loaded as if it were a silicon production wafer.

As discussed in more detail below, the cleaning wafer of the invention has a notch in an outer periphery thereof which allows for proper alignment of the cleaning wafer when loaded into a prober machine. For example, a 1/8"×1/16" notch can be cut in an outer periphery of a ceramic wafer disc. The notch is used as a reference to establish coordinates at 0, 90, 180, and 270 around the wafer disc during alignment of the wafer disc. This allows for orientating the wafer disc and determining that the wafer disc has been centered and properly aligned.

Referring to FIG. 1, a schematic overhead view of a prober machine or system 10 is depicted, which can use the cleaning wafer according to the invention to clean probe pins on a probe card. The prober system 10 is basically an automated wafer handler that is used to interface a semiconductor wafer with a testing device by using the probe pins on the probe card for the electrical connections. The prober system 10 is run by software designed to accommodate a special cleaning cycle using the cleaning wafer of the invention to remove oxides and other debris from the probe pins.

The prober system 10 includes a load station 12 having a manual loading tray with a drawer that pulls out, allowing a cleaning wafer disc 30 to be placed thereon and inserted into prober system 10. The wafer disc 30 may also be placed on an auxiliary tray located under an indexer 13. The indexer 13 is used for cassette loading of wafer disc 30 automatically. A prealign stage 14 in prober system 10 includes a charge-coupled device (CCD) camera array 16, with optical character recognition (OCR). An optical sensor in camera array 16 detects a notch in cleaning wafer disc 30 to properly align cleaning wafer disc 30 automatically. The cleaning wafer disc 30 is profiled at load position 20 by a profiler device (not shown), discussed in further detail below, to determine the thickness and planarity of cleaning wafer disc 30. The prober system 10 also includes a robotic trolley 18 having a robotic arm that is adapted to transport cleaning wafer disc 30 to the various stages of prober system 10. For example, robotic trolley 18 is utilized to move cleaning wafer disc 30 from the loading tray to prealign stage 14, and from prealign stage 14 to a load position 20. The prober system 10 also includes a probe station 22.

Figure 2:
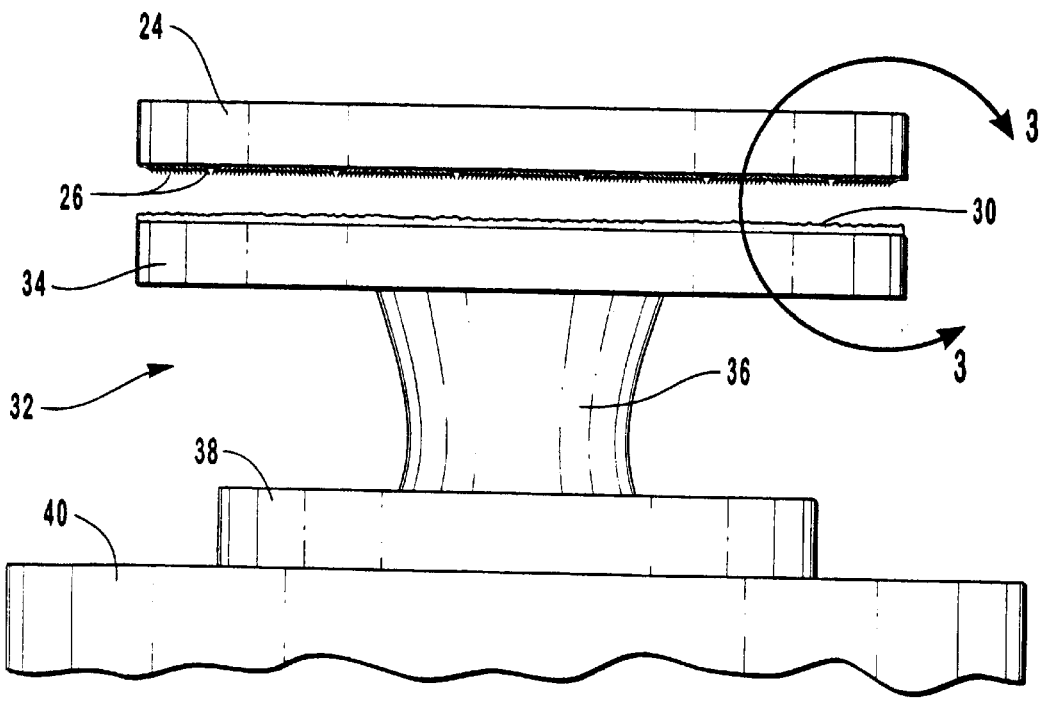
FIG. 2 is a side view of part of the prober system of FIG. 1, showing the cleaning wafer in position to clean the probe pins on a probe card.
Figure 3:
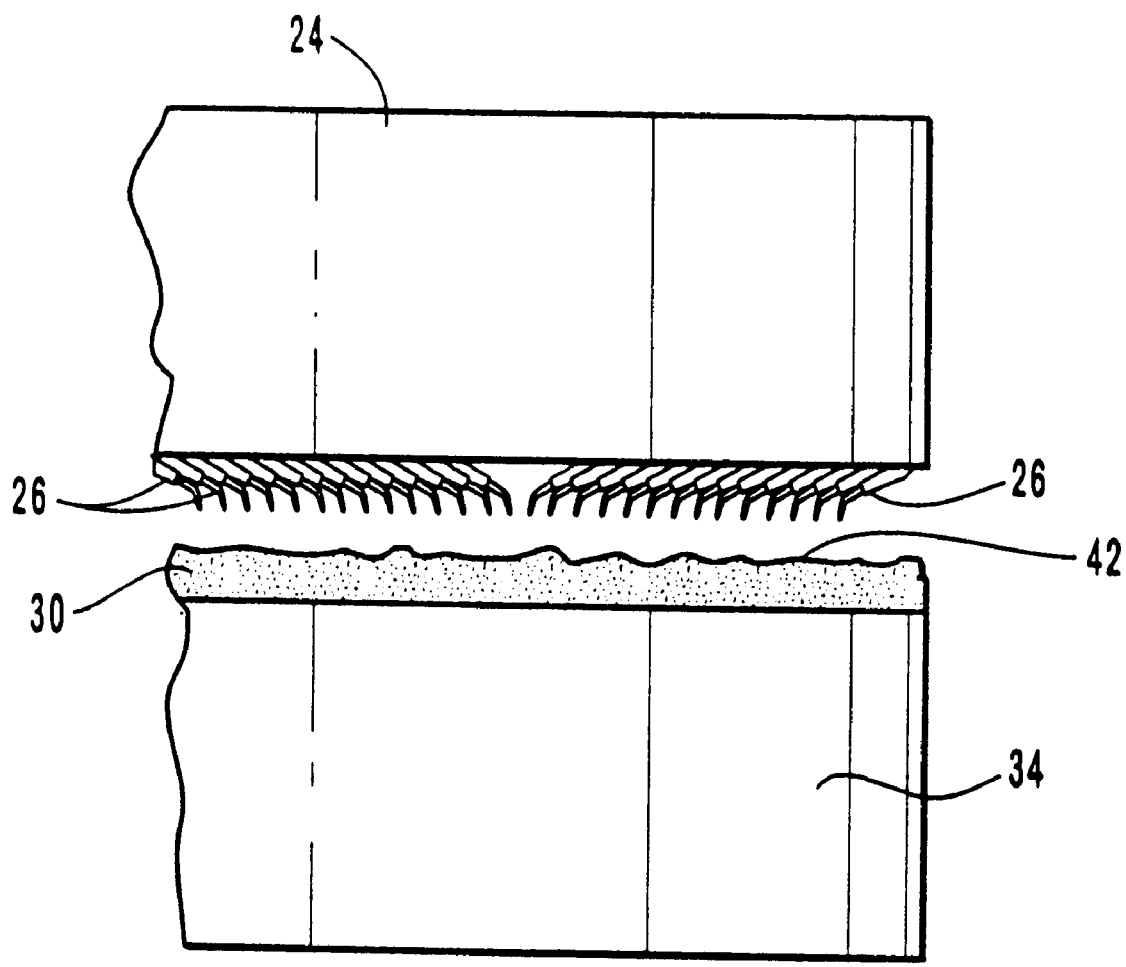
FIG. 3 is an enlarged sectional side view taken along line 3—3 of FIG. 2, depicting in more detail the probe pins in position to be cleaned by the cleaning wafer according to the invention.

As shown in FIGS. 2 and 3, a means for supporting cleaning wafer disc 30 in the form of a support device 32 is provided in prober system 10. The support device 32 can be a vacuum chuck used to hold cleaning wafer disc 30 in position under a probe card 24 with probe pins 26 at probe station 22. The cleaning wafer disc 30 is held such that an abrasive surface 42 of wafer disc 30 faces probe pins 26 to be cleaned. The support device 32 has a top portion 34 such as a chuck top which supports cleaning wafer disc 30, and a z-stage section 36, which is interposed between top portion 34 and a forcer section 38 that floats pneumatically against a platen 40. The forcer section 38 moves z-stage section 36 and has the ability to compensate for any unevenness of cleaning wafer disc 30 and variations in surface height of cleaning wafer disc 30.

When wafer disc 30 is placed on the chuck top of support device 32, the center of wafer disc 30 should align exactly with the center of the chuck top. Due to various reasons, however, this alignment does not always occur and the profiler device is employed to perform the alignment. The profiler device hardware includes an electronics control module (ECM) and a pneumatic sensor. The profiler device measures the wafer disc diameter and finds the center of the wafer disc in relation to the center of the chuck top. The profiler device then sends the exact wafer location information to support device 32 so that proper adjustments are made. The profiler device uses backside spindle contact to measure the profile, thickness, and diameter of the wafer disc to automatically find the wafer center and wafer edge. The measurements are taken at either 1, 3, 5, or 9 points on the wafer.

The sensor of the profiler device may be lowered into operating position or raised into a ring carrier under program control. The sensor emits a stream of air which is used to detect back pressure, that is, how much air is being reflected or bounced back into the sensor from a surface. This detected back pressure is used to determine the thickness of the wafer disc under the sensor. The detected back pressure is compared by the electronics to a preset reference. The output of this comparator function can be one of three states: sensor less than a reference, sensor equal to a reference, or sensor greater than a reference. The comparator output is sensed by the profiler software. For example, the ECM can be set up so that the equal condition occurs when the wafer disc (or chuck top) is 10 mils below the sensor. This 10-mil distance is the reference distance, which means the wafer disc is more than 10 mils from the sensor, exactly 10 mils from the sensor, or less than 10 mils from the sensor. To measure wafer thickness, z-stage section 36 is raised up until the comparator switches from the "wafer more than 10 mils from sensor" state into either the "exactly 10 mils from sensor" state or the "less than 10 mils from sensor" state.

FIG. 3 shows an enlarged side view of probe card 24 with probe pins 26 thereon which are positioned to be contacted with abrasive surface 42 of cleaning wafer disc 30 supported on top portion 34. The probe card 24 can have about 600 to 800 or more pins on a printed circuit board for probe card 24. The probe pins 26 are preferably at about an 8 angle orientation from a horizontal plane.

Figure 4A:
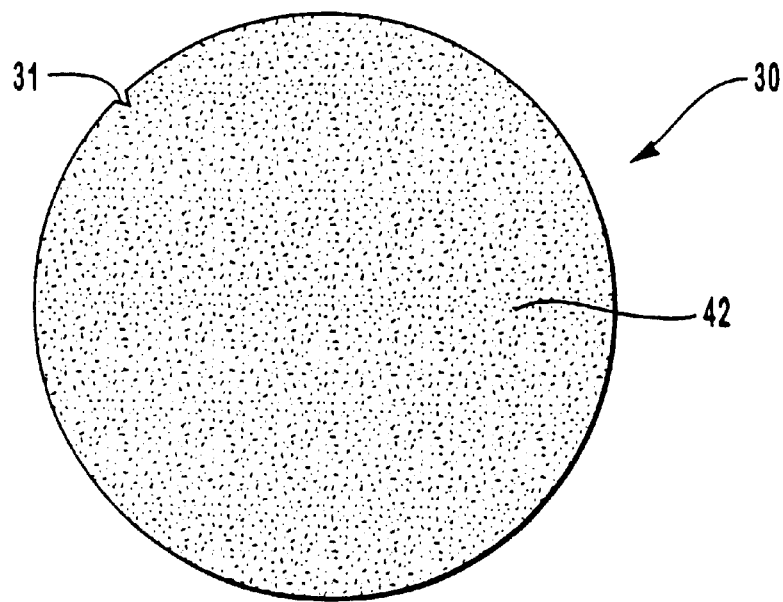
FIG. 4A is a plan view of one embodiment of a cleaning wafer according to the present invention that can be utilized in the system of FIG. 1.

FIG. 4A shows more detail of cleaning wafer disc 30 with abrasive surface 42, which can be used in prober system 10 to clean probe pins 26 on probe card 24. The cleaning wafer disc 30 has a notch 31 along the outer periphery thereof to provide for proper alignment of wafer disc 30 at prealign stage 14 in prober system 10.

Figure 4B:
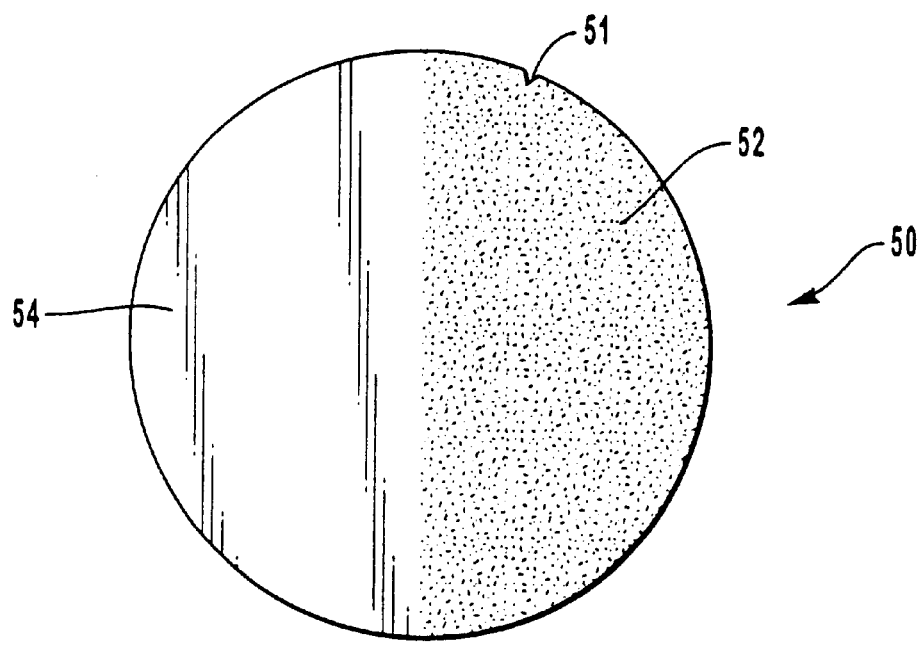
FIG. 4B is a plan view of another embodiment of a cleaning wafer according to the present invention that can be utilized in the system of FIG. 1.

FIG. 4B depicts another embodiment of the cleaning wafer of the invention in the form of a cleaning wafer disc 50, which can also be utilized in prober system 10 to clean probe pins 26 on probe card 24. The cleaning wafer disc 50 has a notch 51 along the outer periphery thereof to provide for proper alignment of wafer disc 50 in prober system 10. The cleaning wafer disc 50 has two distinct sections on the surface thereof that will face the probe pins 26, including an abrasive section 52 which can be made of a ceramic material, and a conductive section 54 made of an electrically conductive material such as a metal. As discussed in more detail below, conductive section 54 allows probe pins 26 to be tested during the cleaning cycle without having to remove cleaning wafer disc 50 from prober system 10.

In operating prober system 10 of FIG. 1 in order to run a cleaning cycle for probe pins 26 on probe card 24, the various components of prober system 10 utilized during testing of silicon production wafers are also employed to align and load the cleaning wafer. Thus, cleaning wafer disc 30 is placed in the manual loading tray at load station 12 as indicated by arrow A to begin a cleaning cycle for prober system 10. Alternatively, the wafer disc 30 can be placed in an auxiliary tray from indexer 13. The robotic trolley 18 picks up cleaning wafer disc 30 as indicated by arrow B, and moves cleaning wafer disc 30 to prealign stage 14 as indicated by arrow C, where cleaning wafer disc 30 is spun to locate the notch thereon. The robot arm on robotic trolley 18 picks up cleaning wafer disc 30 and slides wafer disc 30 over to where it is perfectly centered on prealign stage 14, and wafer disc 30 is reoriented to have a start position of from 0 to 360 (e.g., 0, 90, 180, 270) from the notch thereon. The robot arm then moves wafer disc 30 to load position 20 as indicated by arrow D and onto top portion 34 of support device 32, which in turn is moved to probe station 22 as indicated by arrow E so that wafer disc 30 is underneath probe card 24. The vertical or "z" height of support device 32 is then adjusted up and down as needed to perform the cleaning operation. The cleaning wafer disc 30 is kept stationary beneath probe card 24 during the cleaning cycle as probe pins 26 are touched down on wafer disc 30. The probe pins 26 can be repeatedly contacted with cleaning wafer disc 30 as needed to remove unwanted debris from probe pins 26. The cleaning wafer disc 30 is removed from support device 32 and from the prober machine when cleaning of probe pins 26 has been completed.

When the probe pins are contacted with the cleaning wafer of the invention, a certain amount of over-travel or flexing of the pins occurs. For example, after initial contact of the probe pins on the surface of the cleaning wafer, the z height of the cleaning wafer can be further increased so that the pins have about a 3 to 5 mil over-travel. There are two options for moving the probe pins to produce a desired over-travel. The first option is simply to move the probe pins up and down, which will bend the probe pin tips up and down. The second option is to utilize a jog mode in which the probe pins come down on the cleaning wafer, press down, and then move up. In the jog mode, the probe pins are moved in the x direction, the y direction, and then an x-y direction so that the probe pins are being moved in a generally octagonal pattern in three-dimensions while contacting the cleaning wafer. This allows the probe pin tips to be cleaned all over.

The prober system 10 is configured to automatically load the cleaning wafer to begin a cleaning cycle, perform some touch downs of the probe pin tips on the cleaning wafer to remove debris from the probe pin tips, unload the cleaning wafer, and resume testing of production wafers. Accordingly, a prober control is employed capable of running an external routine that will control prober system 10 so that the necessary commands required to perform the cleaning cycle are executed. For example, a portable computer can be operatively connected to prober system 10 to run a generic communications program. Such a program can instruct prober system 10 to profile a loaded cleaning wafer to determine the thickness and planarity of the cleaning wafer so that any variations can be compensated for by z-stage section 36 on support device 32. The program can also instruct prober system 10 to move the cleaning wafer to a specific x-y location that centers the chuck/wafer under the center of probe card 24, and then z-up to the current z-work-height plus the entered z over-travel value. The program can then tell prober system 10 to unload the cleaning wafer to the manual loading tray or the auxiliary tray.

The prober system 10 can be configured to load the cleaning wafer after a set number of probe pin touch downs on a production wafer, or the probe pins can be randomly tested to see whether or not a cleaning cycle is needed. Testing criteria can be built into production test programs so that the resistivity of the probe pins is checked to determine if cleaning is required. For example, resistance in the probe pins can be measured such that if resistivity increases by more than 4 ohms in the probe pins, an error signal is triggered and a cleaning cycle is commenced.

Alternatively, correlation failure tests can be run to check the probe pins for debris build-up. For example, a whole production wafer can be run on one system and then the production wafer can be run on another system. A map overlay is then done to see bin failure swapping. If one site on the tested probe card varies from any of the other sites by more than a standard deviation, a site difference signal is triggered and production will stop. The cleaning wafer of the invention can then be used to clean the probe pins before production is continued.

The probe pins on the probe card can be electrically tested during the cleaning operation to determine if the probe pins have been sufficiently cleaned, such as by gauging the resistance of the probe pins. For example, a production wafer can be shuttled back and forth to the probe card or a production wafer can be placed near the probe card to provide a ground for the probe pins so that the pins can be electrically tested to determine whether the cleaning job is sufficient. A continuous cycle between the production wafer and the cleaning wafer can be run until electrical testing proves that the probe pins have been sufficiently cleaned, and then regular production and testing of silicon wafers can be resumed.

In addition, as discussed above, the cleaning wafer can include a conductive section on a surface thereof, allowing the probe pins to be tested during the cleaning cycle without having to remove the cleaning wafer away from the probe card. The conductive section can be used as an electrical ground site for testing the probe pins to determine if the cleaning has been sufficient. For example, the probe pins can be alternately cleaned and tested during the cleaning cycle until it is determined that the cleaning is satisfactory through various diagnostics. Once the probe pins have been sufficiently cleaned, production can be resumed by shuttling a production wafer into the prober machine.

Further, after a predetermined period of use, the cleaning wafer itself can be cleaned of the oxides and other materials that have been scraped off the probe pins, allowing the cleaning wafer to be repeatedly reused. In another option, the life of the cleaning wafer or time between cleanings of the wafer can be extended by simply using a different notch offset for wafer orientation. The CCD in the prealign stage can be instructed, through software, to look for the notch and rotate the cleaning wafer to a different position so the same cleaning wafer is used for another set of cleaning cycles. For example, there can be one setting at 0, which can be used for 100 cleaning cycles, another setting at 90, which can be used to enable another 100 cleaning cycles, a different setting at 180, which can be used for another 100 cleaning cycles, and another setting at 270, which can be used to enable another 100 cleaning cycles. The different settings allow each set of 100 cleaning cycles to be performed at different locations on the cleaning wafer, thereby extending the life of the cleaning wafer.

In another embodiment, a plurality of metal traces such as gold traces can be placed on the cleaning wafer. The metal traces can be placed on the cleaning wafer by a conventional deposition process such as chemical vapor deposition. The metal traces can serve as ground sites for electrically testing the probe pins during a cleaning cycle, and can also be used to provide a first-to-last contact planarity range for the probe pins. Since the probe pins on a probe card are at various heights, by touching the pins down on the metal traces, it can be determined incrementally at what point individual probe pins contact the surface of the cleaning wafer.

The cleaning wafer embodiments of the invention can thus be used in cleaning probe pin tips and to test whether the probe pin tips are sufficiently clean, and can be used in determining the planarity of the probe pins.

The cleaning wafer of the invention allows wider probe cards to be effectively cleaned while still loaded on a production prober machine. This allows the probe pins to be in service longer without having to remove the probe card for cleaning, reinstall a clean probe card, and rerun a complete new set-up for the clean probe card. Thus, the invention results in a decrease in production downtime that is associated with the removal of a known good probe card that just needs the probe pin tips scrubbed or cleaned.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A wafer for cleaning a semiconductor device probe, the wafer comprising:
   a first planar surface including a ceramic material for removing unwanted debris from a probe tip;
   a second surface opposing said first surface, the second surface having a coating that is opaque to infrared radiation; and
   an outer periphery between the first and second surfaces, the outer periphery having a single notch formed therein for orienting the wafer in a stationary position during said removing of unwanted debris.

2. The wafer of claim 1, wherein the ceramic material is selected from the group consisting of alumina, silicon nitride, silicon carbide, and mixtures thereof.

3. The wafer of claim 1, wherein the wafer has a substantially circular shape.

4. The wafer of claim 1, wherein the wafer has a thickness in a range from about 20 mil to about 40 mil.

5. The wafer of claim 1, wherein a portion of the first surface of the wafer is made of an electrically conductive material.

6. The wafer of claim 1, wherein the first surface has metal traces deposited thereon.

7. A wafer for cleaning a semiconductor device probe, the wafer comprising:
   a planar substrate with an outer periphery, said substrate having a single notch formed in said outer periphery;
   an abrasive material on the substrate for removing unwanted debris from said semiconductor device probe; and a material on the substrate, wherein said material is opaque to nonionizing electromagnetic radiation.

8. The system of claim 7, wherein at least a portion of the substrate comprises a ceramic material.

9. The system of claim 8, wherein the ceramic material is selected from the group consisting of alumina, silicon nitride, silicon carbide, and mixtures thereof.

10. The system of claim 7, wherein said nonionizing electromagnetic radiation is infrared radiation.

11. The system of claim 7, wherein the substrate has a thickness in a range from about 20 mil to about 40 mil.

12. The system of claim 7, wherein the substrate has a substantially circular shape.

13. The system of claim 7, wherein the substrate has a thickness in a range from about 10 mil to about 50 mil.

14. The system of claim 7, wherein a portion of the substrate is made of an electrically conductive material.

15. The system of claim 7, wherein the substrate has metal traces deposited on a surface thereof.

16. The system of claim 15, wherein the metal traces are gold traces.

17. A wafer for cleaning a semiconductor device probe, the wafer comprising:

a first surface including a material for removing unwanted debris from said semiconductor device probe, said material being selected from the group consisting of alumina, silicon nitride, silicon carbide, and mixtures thereof;

a second surface opposing said first surface, the second surface having a coating thereon, wherein said coating is opaque to infrared radiation; and a circular outer periphery between the first and second surfaces, the outer periphery having a single notch formed therein for orienting the wafer in a stationary position during said removing of unwanted debris.

18. The wafer of claim 17, wherein the wafer has a thickness in a range from about 20 mil to about 40 mil.

19. The wafer of claim 17, wherein a portion of the first surface of the wafer is made of an electrically conductive material.

20. The wafer of claim 17, wherein the first surface has metal traces deposited thereon.

* * * * *